United States Patent [19]
Mori et al.

[11] Patent Number: 5,872,803
[45] Date of Patent: Feb. 16, 1999

[54] LASER DIODE PUMPED SOLID-STATE LASER APPARATUS

[75] Inventors: Hiroshi Mori; Kenji Suzuki, both of Sodegaura, Japan

[73] Assignee: Mitsui Chemicals, Inc., Tokyo, Japan

[21] Appl. No.: 840,693

[22] Filed: Apr. 25, 1997

[30] Foreign Application Priority Data

Apr. 26, 1996 [JP] Japan .................................. 8-107657

[51] Int. Cl.⁶ ........................................... H01S 3/091
[52] U.S. Cl. ............................. 372/75; 372/34; 372/36; 372/69; 372/70; 372/92; 372/98; 372/107
[58] Field of Search ............................ 372/34, 36, 43, 372/50, 69, 70, 71, 72, 75, 92, 98, 99, 107, 108, 39

[56] References Cited

U.S. PATENT DOCUMENTS

| | | | |
|---|---|---|---|
| 4,809,291 | 2/1989 | Byer et al. | 372/75 |
| 4,864,584 | 9/1989 | Martin | 372/75 |
| 4,872,177 | 10/1989 | Baer et al. | 372/75 |
| 4,951,294 | 8/1990 | Basu et al. | 372/75 |
| 5,062,117 | 10/1991 | Anthon et al. | 372/75 |
| 5,170,409 | 12/1992 | Nightingale et al. | 372/107 |
| 5,181,214 | 1/1993 | Berger et al. | 372/34 |
| 5,267,252 | 11/1993 | Amano | 372/34 |
| 5,287,381 | 2/1994 | Hyuga et al. | 372/75 |
| 5,341,388 | 8/1994 | Masuda et al. | 372/36 |

FOREIGN PATENT DOCUMENTS

| | | | |
|---|---|---|---|
| 497375 | 8/1992 | Japan | 372/75 X |
| 4283977 | 10/1992 | Japan | 372/75 X |
| 669567 | 3/1994 | Japan | 372/75 X |

*Primary Examiner*—Brian Healy
*Attorney, Agent, or Firm*—Birch, Stewart, Kolasch & Birch, LLP

[57] ABSTRACT

A solid-state laser apparatus is composed of a semiconductor laser device 17, a laser medium 13 for generating oscillated light, a non-linear optical device 12 for converting the oscillated light to non-linear light, a laser holder 17a and a base plate 19 for holding the semiconductor laser device 17, and a crystal holder 3 for holding the laser medium 13 and the non-linear optical device 12. The laser holder 17a, base plate 19 and crystal holder 3 are fixed with an adhesive or the like after positional adjustment under light pressure and temporary tightening. A laser diode pumped solid-state laser apparatus is thus obtained which is simplified in assembling and positioning of optical components and can be stably operated regardless of temperature changes.

7 Claims, 2 Drawing Sheets

LASER DIODE PUMPED SOLID-STATE LASER APPARATUS

BACKGROUND OF THE INVENTION

1. Field of the Invention

The present invention relates to a laser diode pumped solid-state laser apparatus which has a laser medium and a non-linear optical element in a resonator, for emitting fundamental-wave oscillated light and non-linear light from the laser medium excited by a semiconductor laser.

2. Description of the Related Art

A solid-state laser apparatus is known which uses a semiconductor laser composed of GaAlAs or the like for exciting a laser medium such as Nd:YAG crystal provided in a resonator to generate a laser light.

For generation of shorter wave-length laser light, numerous types of solid-state laser apparatuses have been proposed which have substantially a laser medium and a non-linear optical crystal provided in a common resonator to convert an oscillated light output of the laser medium to a non-linear light such as a second harmonic (for example, as disclosed in Japanese Unexamined Patent Publications JP-A 4-283977 (1992) and JP-A 6-69567 (1994), and Japanese Unexamined Utility Model JP-U 4-07375 (1992)). When the laser medium is YAG crystal and the non-linear optical crystal is titanium potassium phosphate $KTiOPO_4$ (abbreviated to KTP), the oscillated light from the YAG crystal can be converted from its original wavelength of 1064 nm to a half of 532 nm of green light wavelength.

It is however needed for such a donventional solid-state laser apparatus to position the semiconductor laser, laser medium, and non-linear optical element at high accuracy. When the optical axes of pumping light, oscillated light, and non-linear light fail to be aligned on the order of micrometers, the efficiency of light conversion will be remarkably declined.

Also, an adverse change in the distance between the optical components or the optical device and its holding member due to thermal expansion may result in decreases of conversion efficiency due to displacement of the optical axis or fluctuations of output due to mode hopping.

SUMMARY OF THE INVENTION

It is an object of the present invention to provide a laser diode pumped solid-state laser apparatus which is simplified in assembling and positioning optical components and can be stably operated regardless of temperature changes.

The invention provides a laser diode pumped solid-state laser apparatus comprising:

a semiconductor laser for emitting a pumping light;

a laser medium provided in a resonator, for generating an oscillated light upon being excited with the pumping light;

curved surface mirror means defining one end of the resonator;

a first holding member for holding the semiconductor laser, the first holding member having a sliding face substantially vertical to an optical axis of the pumping light;

a second holding member for holding the curved surface mirror means and the laser medium, the second holding member having a sliding face substantially vertical to an optical axis of the resonator, the first and second holding members being arranged so that the sliding faces face each other; and fastening means for fastening the first and second holding members together According to the invention, the first holding member for holding the semiconductor laser and the second holding member for holding the curved surface mirror means and laser medium have sliding faces which are substantially perpendicular to the optical axis of the pumping light, and the sliding faces are arranged to face each other so as to be smoothly moved along a direction in the sliding faces in relation to each other when aligning the optical axis. Accordingly, the positioning of the members will be carried out with ease and accuracy. The two sliding faces of the first and second holding members may contact each other directly or indirectly via a thin sheet of a slidable, highly thermal conductive material, such as a copper foil or a strip, interposed between the sliding faces. This allows the pumping light and the oscillated light to be aligned with the optical axis accurately and quickly before the members are securely fixed by an adhesive or the like.

The present invention is particularly effective when the mirror means is curved. In a linear resonator with the curved surface mirror, there is provided a single optical axis, which coincides with a normal at a specific point of the curved surface mirror. According to the invention, the pumping light can be easily aligned with the optical axis of the resonator by contacting the first and second holding members in a plane vertical to the optical axis.

As the alignment with the optical axis is easily controlled in two dimensions of the plane vertical to the optical axis with the first and second holding members remaining spaced by a constant distance along the optical axis, thus the pumping light, the oscillated light, and the non-linear light can be aligned to each other in the optical axis at high accuracy and speed. Also, the thermal contact between the first and second holding members is enhanced thus permitting ease of the thermal control on the two members. Furthermore, the interfaces between the first and second holding members and the thermo-electric cooler are vertical to the optical axis hence ensuring stable control over the temperature regardless of a small displacement along the interface during the alignment with the optical axis.

In the invention it is preferable that the apparatus further comprises tightening means for tightening the first and second holding members with a variable tightening pressure exerted vertically to the sliding faces.

According to the invention, a relative distance along the optical axis between the first and second holding members can be precisely adjusted on the order of micrometers by urging and slightly deforming the first and second holding members with the variable tightening pressure in a direction vertical to their sliding faces.

Further in the invention, it is preferable that the apparatus further comprises a thermo-electric cooler such as a Peltier device provided in a housing which has a window for directing the laser beam outwardly and the first holding member is mounted on the thermo-electric cooler.

According to the present invention, the thermo-electric cooler is used to control the temperature of the first holding member thus enabling the temperature of the other optical components including the semiconductor laser and the laser medium to be collectively controlled. Since it is unnecessary to assign the thermo-electric cooler to each optical device, the apparatus of the invention will be reduced in size and weight. Also, the semiconductor laser and the laser medium are almost equal in thermal condition and can thus be monitored and controlled using one single temperature sensor.

Further in the invention, it is preferable that the first holding member has a second face confronting the sliding face, which second face is arranged to face a heat absorbing side of the thermo-electric cooler.

According to the invention, since the second face of the first holding member which is parallel to the sliding face of the second holding member is arranged to face the heat absorbing side of the thermo-electric cooler, the thermal contact between the second holding member and the thermo-electric cooler will be improved by the presence of the first holding member. Also, as the members are aligned with the optical axis, heat out of the second holding member can almost uniformly be conducted via the first holding member to the thermo-electric cooler regardless of the position of the second holding member in the sliding face thus ensuring a stability of the temperature control. The second face of the first holding member and the heat absorbing side of the thermo-electric cooler may be contacted each other directly or indirectly via a highly thermal conductive adhesive or grease applied therebetween.

Further in the invention, it is preferable that the apparatus further comprises a non-linear optical device provided in the resonator for converting the oscillated light to a non-linear light, and held by the second holding member.

According to the invention, both the laser medium and the non-linear optical device are held by the single holding member thus reducing a positional dislocation therebetween.

Further in the invention, it is preferable that the curved surface mirror means is provided on a pumping light input side of the laser medium.

According to the invention, since the curved surface mirror means constituting the resonator is arranged integral with the laser medium, the optical alignment between the resonator and the laser medium is not needed. This will provide ease of assembling the optical components and eliminate the optical dislocation due to physical vibration.

Further in the invention, it is preferable that the curved surrace mirror means is provided on a non-linear light output side of the non-linear optical device.

According to the invention, since the curved surface mirror means constituting the resonator is arranged integral with the nonlinear optical device, the optical alignment between the resonator and the non-linear optical device is not needed. This will provide ease of assembling the optical components and eliminate the optical dislocation due to physical vibration.

Thus the laser diode pumped solid-state laser apparatus can be realized which is simplified in assembling and positioning optical components and can stably be operated regardless of temperature changes.

BRIEF DESCRIPTION OF THE DRAWINGS

Other and further objects, features, and advantages of the invention will be more explicit from the following detailed description taken with reference to the drawings wherein:

FIG. 3A illustrates an arrangement of a curved surface mirror 11 formed on the pumping light input side of a laser medium 13; and FIG. 3B illustrates another arrangement of the curved surface mirror 11 formed on the non-linear light output side of a non-linear optical device 12.

DETAILED DESCRIPTION OF THE PREFERRED EMBODIMENTS

Figure 1:
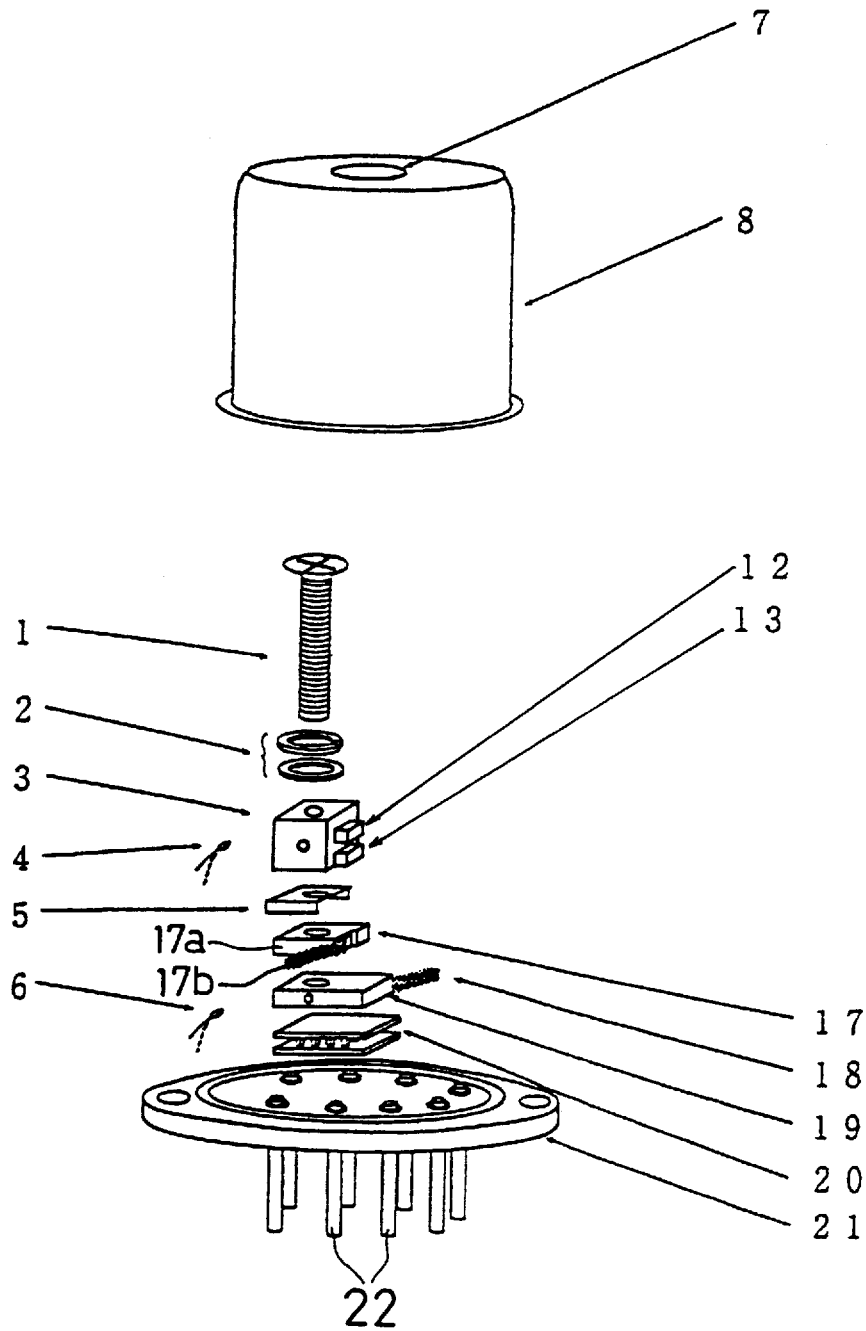
FIG. 1 is an exploded perspective view showing one embodiment of the invention.

Now referring to the drawings, preferred embodiments of the invention are described below.

Figure 2:
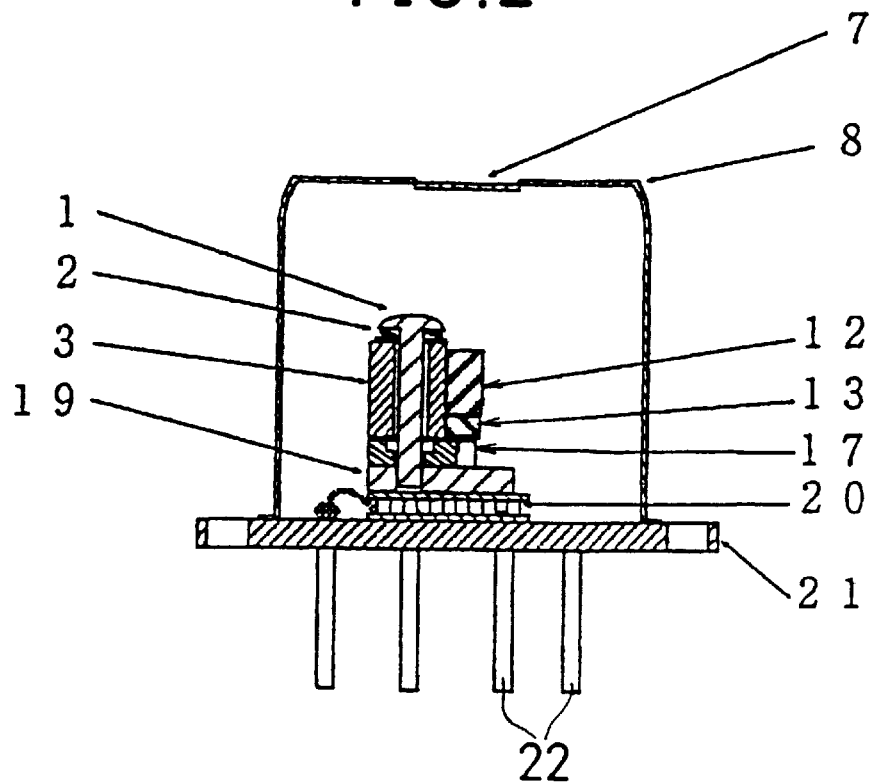
FIG. 2 is a center cross sectional view of the embodiment of the invention.

FIG. 1 is an exploded perspective view showing one embodiment of the present invention and FIG. 2 is a center cross sectional view of the same. A header 21 is a metallic plate member constituting a housing of the apparatus together with a cap 8 and has a plurality of lead electrodes 22 fixedly mounted thereto in electrical insulating and air tightness relationship. An electronic cooling device or Peltier device 20 is mounted on the upper side of the header 21 and leads of the Peltier device 20 are connected to any of the lead electrodes 22.

There is a metallic hexahedron-shaped base plate 19 and mounted on the Peltier device 20. The base plate 19 has a vertical holding hole therein provided at the inner surface with a female thread for engagement with a fastening screw 1. One end of a lead 18 is electrically connected at the side face of the base Plate 19 and the other to one of the lead electrodes 22. The lead 18 is extended as the cathode of a semiconductor laser 17. The base plate 19 has also a small slot provided in another side thereof for holding a thermistor 6 which serves as a temperature sensor. The thermistor 6 has a lead not connected to the lead electrodes 22 but arranged to connect to an external device for thermal adjustment without the cap 8.

A metallic hexahedron-shaped laser mount 17a is mounted on the upper side of the base plate 19. The semiconductor laser device 17 of a chip form is fixedly mounted to one side of the laser mount 17a. The cathode of the semiconductor laser device 17 is linked via the laser mount 17a, and the base plate 19 to the lead 18. The anode of the semiconductor laser device 17 is connected to one end of a lead 17b which is in turn connected at the other end to any one of the lead electrodes 22. The laser mount 17a has a through hole in which the fastening screw 1 can be inserted. Accordingly, the laser mount 17a and the base plate 19 contact each other for ensuring good electrical connection and thermal conduction.

A crystal holder 3 for holding a laser medium 13 and a non-linear optical device 12 is mounted vertical to the optical axis on the upper side of the laser mount 17a. The laser mount 17a and the crystal holder 3 may directly contact each other, but a shim 5 made of a copper foil or other material which is higher in joining tightness and thermal conductivity is preferably interposed to increase the joining tightness and the thermal bonding between the laser mount 17a and the crystal holder 3. The crystal holder 3 is made of a highly thermal conductive material such as copper for transferring heat generated in the laser medium 13 and the non-linear optical device 12 to the laser mount 17a. The crystal holder 3 has a slot provided in one side thereof for holding another thermistor 4 which serves as a temperature sensor. The leads of the thermistor 4 are also connected to the lead electrodes 22. In addition, the crystal holder 3 has a through hole provided therein in which the fastening screw 1 can be inserted.

Figure 3A:
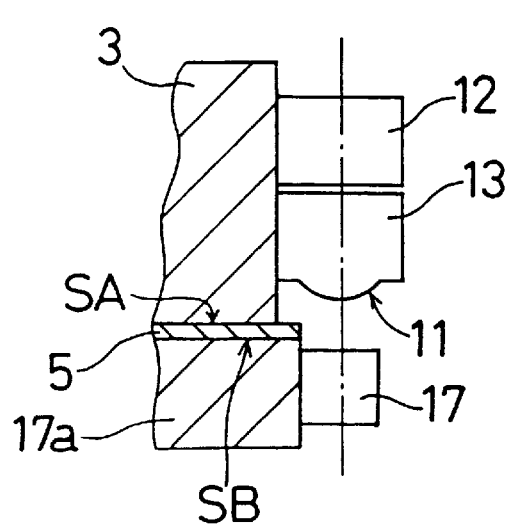
FIGS. 3A and 3B are schematic views showing the shape of a resonator.
Figure 3B:
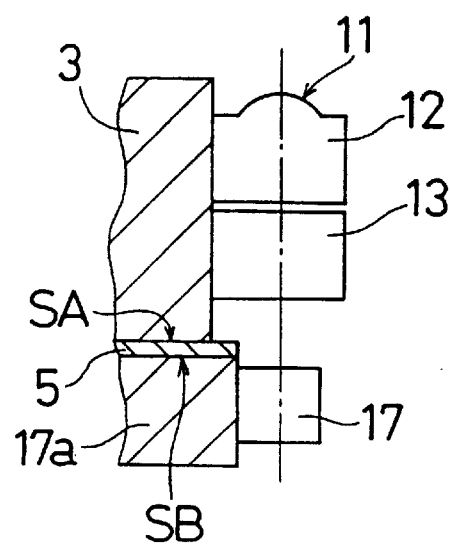

FIGS. 3A and 3B are schematic views showing the shape of a resonator. More specifically, FIG. 3A illustrates an arrangement of a curved surface mirror 11 formed on a pumping light input side of the laser medium 13 and FIG. 3B illustrates another arrangement of the curved surface mirror 11 formed on a non-linear light output side of the non-linear optical device 12. The crystal holder 3 and the laser mount 17a sandwiching the shim 5 therebetween have their respective sliding faces SA and SB arranged substantially vertical to the optical axis of the resonator.

Referring to FIG. 3A, the curved surface mirror 11 which incorporates one end mirror of the resonator i5 formed by tailoring the pumping light input side of the laser medium 13 to a curved surface by photolithograph technique and covering the same with a coating which has a high reflectivity for a wavelength of the oscillated light from the laser medium 13. The non-linear light output side of the non-linear optical device 12 is shaped to a planar surface and equally covered with a coating which has a high reflectivity for the wavelength of the oscillated light from the laser medium 13, thus forming the other end mirror of the resonator.

In FIG. 3B, the pumping light input side of the laser medium 13 is shaped to a planar surface and covered with a coating which has a high reflectivity for the wavelength of the oscillated light from the laser medium 13, thus forming one end mirror of the resonator. The curved surface mirror 11 which incorporates the other end mirror of the resonator is formed by tailoring the non-linear light output side of the non-linear optical device 12 to a curved surface by photolithography technique and covering the same with a coating which has a high reflectivity for the wavelength of the oscillated light from the laser medium 13.

As the curved surface mirror 11 of the resonator is provided integral with the laser medium 13 or the non-linear optical device 12, the alignment of their optical axes is simplified thus contributing to the easy assembly of the optical components and eliminating dislocation of the optical axis due to vibration or the like.

Returning to FIG. 2, the base plate 19, the laser mount 17a, the shim 5, and the crystal holder 3 which are directly laid one over the other in slidable relationship are contacted to one another before fixing. These members are integrally fixed by turning the fastening screw 1 after the alignment of their optical axes to obtain good thermal conductivity. The fastening screw 1 is accompanied at upper end with e.g. a couple of washers 2 for preventing loosening.

As the semiconductor laser device 17, the laser medium 13, and the non-linear optical device 12 are fixed as a block onto the heat absorbing side of the Peltier device 20, the block is thermally controlled so that the temperature detected by the thermistor 4 is held constant.

A procedure of positioning the components is now explained. After the base plate 19, the laser mount 17a, the shim 5, and the crystal holder 3 have been laid one over the other, the fastening screw 1 with the two washers 2 is gently screwed in so that its tightening pressure permits a slidable movement along the interface between any two adjacent components which is vertical to the optical axis of the pumping light. At the time, thermally conductive shims of a proper thickness may be interposed between the components to adjust the relative distance.

Then, by positioning the base plate 19 and the laser mount 17a, the optical axis of the pumping light from the semiconductor laser device 17 is positioned. This is followed by sliding the crystal holder 3 in contact with the laser mount 17a in the direction vertical to the optical axis to align the optical axes of the laser medium 13 and the non-linear optical device 12 with the optical axis of the pumping light.

The fastening screw 1 is further screwed in for temporarily tightening of the components in the direction vertical to the optical axis with such a great care that the crystal holder 3 is not displaced in a direction vertical to the optical axis. As the tightening pressure is being controlled, the distance between any two adjacent components can precisely be adjusted on the order of micrometers. Finally, the base plate 19, the laser mount 17a, and the crystal holder 3 are securely bonded to each other by applying an adhesive entirely or partially.

Accordingly, the positioning of the components in two dimensions of a plane vertical to and parallel to the optical axis can precisely be carried out with ease and accuracy.

After the components have been tightened to the header 21, the cap 8 is placed to shield the header 21 in air-tightness. The cap 8 has an aperture provided in a center of the upper side thereof for allowing the non-linear light to run outwardly. The aperture of the cap 8 is closed in air-tightness at the inner side with a window member 7 such as a glass plate. The window member 7 is covered at both sides with AR (anti-reflective) coatings for providing a high transmissivity for a wavelength of the non-linear light.

A concrete construction example is now explained. The example employs Nd:YVO$_4$ crystal of the laser medium 13, KTP (KTiOPO$_4$) crystal of the non-linear optical device 12, and a type of the semiconductor laser device 17 capable of generating a pumping light of 809 nm wavelength.

The pumping light input side of the laser medium 13 is covered with a coating which provides a reflectivity of 99.9% or more at 1064 nm wavelength of the oscillated light from the laser medium 13 and a transmissivity of 95% or more at 809 nm wavelength of the pumping light. Also, the other side of the laser medium 13 and its opposite side of the non-linear optical device 12 are covered with coatings which provide a transmissivity of 99.9% or more at 1064 nm wavelength. The output side of the non-linear optical device 12 is covered with a coating which provides a reflectivity of 99.9% or more at 1064 nm wavelength and a transmissivity of 95% or more at 532 nm wavelength. The resonator is thus defined between the light input side of the laser medium 13 and the light output side of the non-linear optical device 12.

When its laser medium 13 is excited by the pumping light of 809 nm wavelength emitted from the semiconductor laser device 17, the resonator generates a laser oscillation of 1064 nm wavelength and the oscillated light is then converted In wavelength by the non-linear optical device 12 to a second harmonic or non-linear green light of 532 nm wavelength.

Another construction example is explained. The example employs YAG crystal of the laser medium 13, KN (KNbO$_3$) crystal of the non-linear optical device 12. and the type of the semiconductor laser device 17 capable of generating a pumping light of 809 nm wavelength.

The pumping light input side of the laser medium 13 is covered with a coating which provides a reflectivity of 99.9% or more at 946 nm wavelength of the oscillated light from the laser medium 13 and a transmissivity of 95% or more at 809 nm wavelength of the pumping light. Also, the other side of the laser medium 13 and its opposite side of the non-linear optical device 12 are covered with coatings which provide a transmissivity of 99.9% or more at 946 nm wavelength. The output side of the non-linear optical device 12 is covered with a coating which provides a reflectivity of 99.9% or more at 946 nm wavelength and a transmissivity of 95% or more at 473 nm wavelength. The resonator is thus defined between the light input side of the laser medium 13 and the light output side of the non-linear optical device 12.

When the pumping light of 809 nm wavelength is emitted from the semiconductor laser device 17 to excite the laser medium 13, the resonator generates a laser oscillation of 946 nm wavelength and the oscillated light is then converted in wavelength by the non-linear optical device 12 to a second harmonic or non-linear blue-green light of 473 nm wavelength.

Since its resultant non-linear light is propagated along the optical axis and passed through the window member 7 to the outside, the non-linear light is used as a short-wavelength light source for optical data recording, communications, measurement, or other like application.

Although the embodiment has been described for use as the short-wavelength light source including the laser medium 13 and the non-linear optical device 14, the present invention may cover a fundamental-wave laser source which includes the laser medium 13 but not the non-linear optical device 14.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A laser diode pumped solid-state laser apparatus comprising:

a semiconductor laser for emitting a pumping light;

a laser medium provided in a resonator for generating an oscillated light upon being excited with the pumping light;

curved surface mirror means defining one end of the resonator;

a first holding member for holding the semiconductor laser, the first holding member having a sliding face substantially vertical to an optical axis of the pumping light;

a second holding member for holding the curved surface mirror means and the laser medium, the second holding member having a sliding face substantially vertical to an optical axis of the resonator, the first and second holding members being arranged so that the sliding faces face each other; and fastening means for fastening the first and second holding members together.

2. The laser diode pumped solid-state laser apparatus of claim 1, further comprising tightening means for tightening the first and second holding members with a variable tightening pressure exerted vertical to the sliding faces.

3. The laser diode pumped solid-state laser apparatus of claim 2, further comprising a thermo-electric cooler provided in a housing having a window for directing the laser beam outwardly, wherein the first holding member is mounted on the thermo-electric cooler.

4. The laser diode pumped solid-state laser apparatus of claim 3, wherein the first holding member has a second face confronting to the sliding face, the second face being arranged to face a heat absorbing side of the thermo-electric cooler.

5. The laser diode pumped solid-state laser apparatus of any one of claims 1 to 4, further comprising a non-linear optical device provided in the resonator for converting the oscillated light to non-linear light, the non-linear optical device being held by the second holding member.

6. The laser diode pumped solid-state laser apparatus of claim 1, wherein the curved surface mirror means is provided on a pumping light input side of the laser medium.

7. The laser diode pumped solid-state laser apparatus of claim 5, wherein the curved surface mirror means is provided on a non-linear light output side of the non-linear optical device.

* * * * *